(12) United States Patent
Matsumi

(10) Patent No.: US 10,186,569 B2
(45) Date of Patent: Jan. 22, 2019

(54) DISPLAY DEVICE HAVING AN AUXILIARY ELECTRODE ON THE SUBSTRATE WITH AN END SURFACE CONTACTING AN ELECTRODE OF THE ORGANIC LIGHT EMITTING ELEMENT

(71) Applicant: SONY CORPORATION, Tokyo (JP)

(72) Inventor: Tatsuya Matsumi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/510,714

(22) PCT Filed: Sep. 9, 2015

(86) PCT No.: PCT/JP2015/075572
§ 371 (c)(1),
(2) Date: Mar. 13, 2017

(87) PCT Pub. No.: WO2016/047440
PCT Pub. Date: Mar. 31, 2016

(65) Prior Publication Data
US 2017/0278919 A1    Sep. 28, 2017

(30) Foreign Application Priority Data
Sep. 22, 2014    (JP) .................................. 2014-192786

(51) Int. Cl.
*H01L 27/32*    (2006.01)
*H01L 51/52*    (2006.01)

(52) U.S. Cl.
CPC ........ *H01L 27/3279* (2013.01); *H01L 27/323* (2013.01); *H01L 51/5228* (2013.01)

(58) Field of Classification Search
None
See application file for complete search history.

(56) References Cited

U.S. PATENT DOCUMENTS

| | | | | |
|---|---|---|---|---|
| 2008/0224968 | A1* | 9/2008 | Kashiwabara | G09G 3/2003 345/83 |
| 2009/0153046 | A1* | 6/2009 | Hayashi | H01L 27/3276 313/505 |
| 2010/0244664 | A1* | 9/2010 | Fujioka | H01L 51/5212 313/504 |

FOREIGN PATENT DOCUMENTS

| | | | |
|---|---|---|---|
| JP | 2005-031645 | A | 2/2005 |
| JP | 2009-128577 | A | 6/2009 |
| JP | 2012-230928 | A | 11/2012 |
| JP | 2013-054979 | A | 3/2013 |

\* cited by examiner

*Primary Examiner* — Erik Kielin
(74) *Attorney, Agent, or Firm* — Chip Law Group

(57) ABSTRACT

A display device includes a base, an organic light-emitting element including a stacked structure that has a first electrode layer, an organic light-emitting layer, and a second electrode layer that are stacked in order on the base, a drive element that is provided on the base, and drives the organic light-emitting element, and an auxiliary electrode layer provided on the base, and including an end surface that is in contact with the second electrode layer.

11 Claims, 12 Drawing Sheets

[ FIG. 1 ]
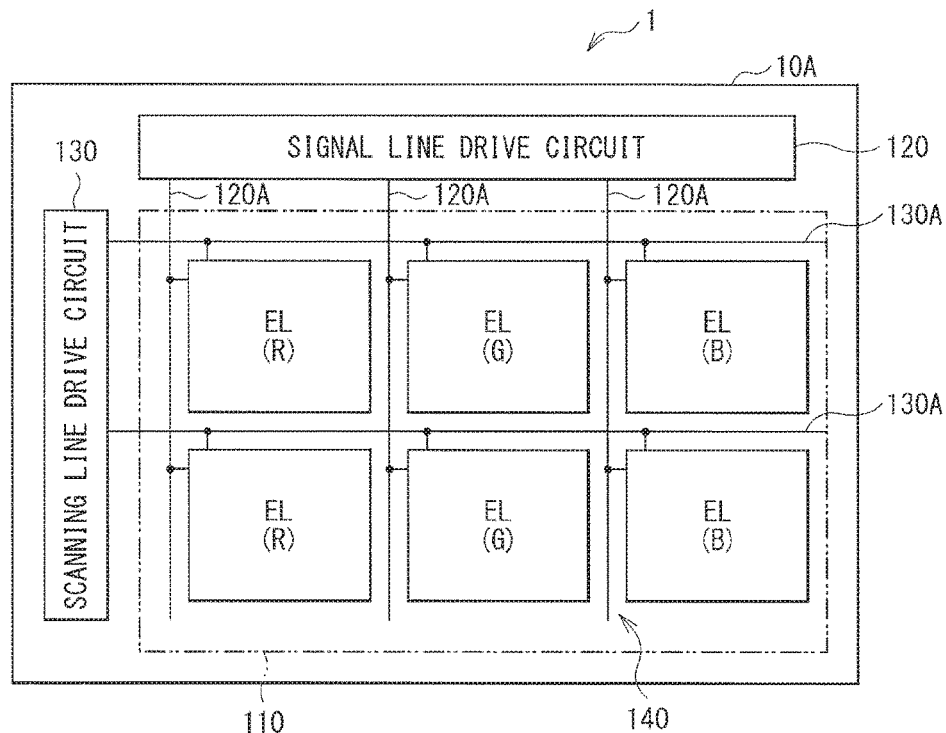
[ FIG. 2 ]
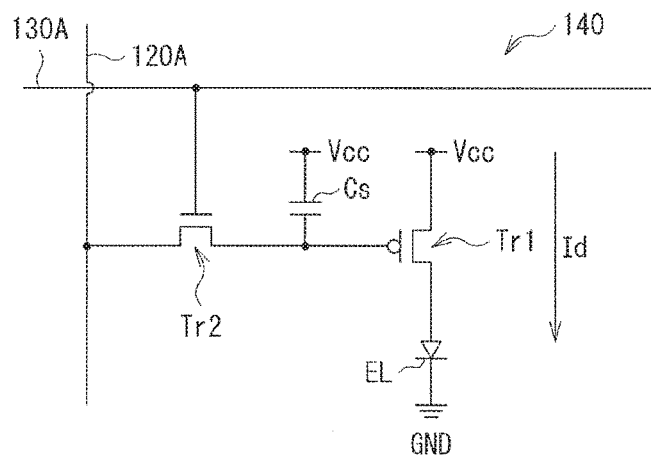

[ FIG. 3 ]
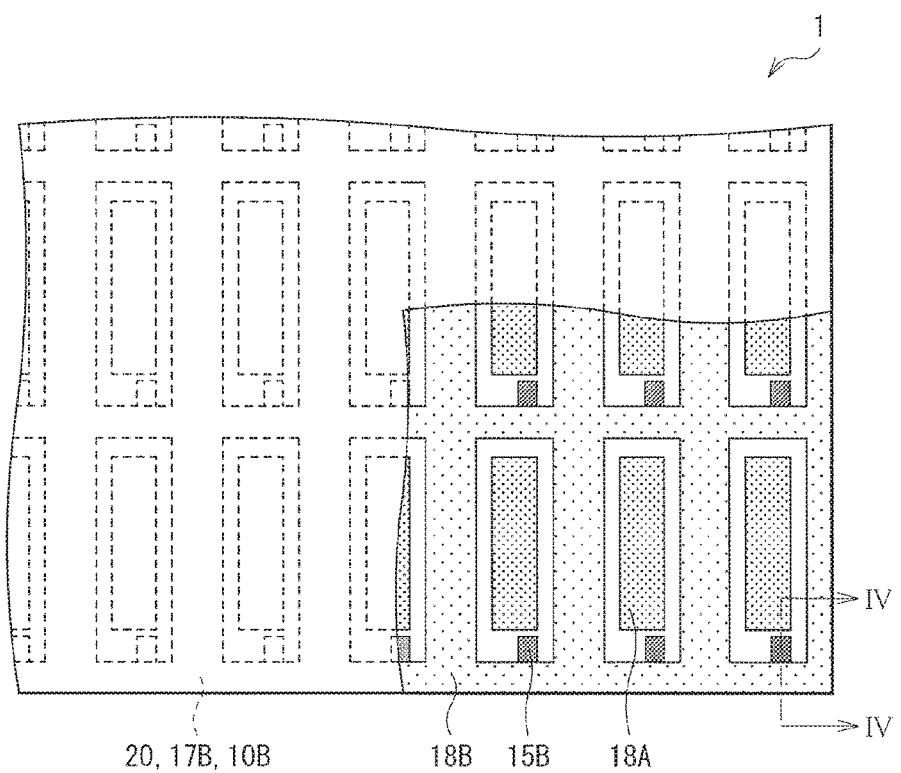

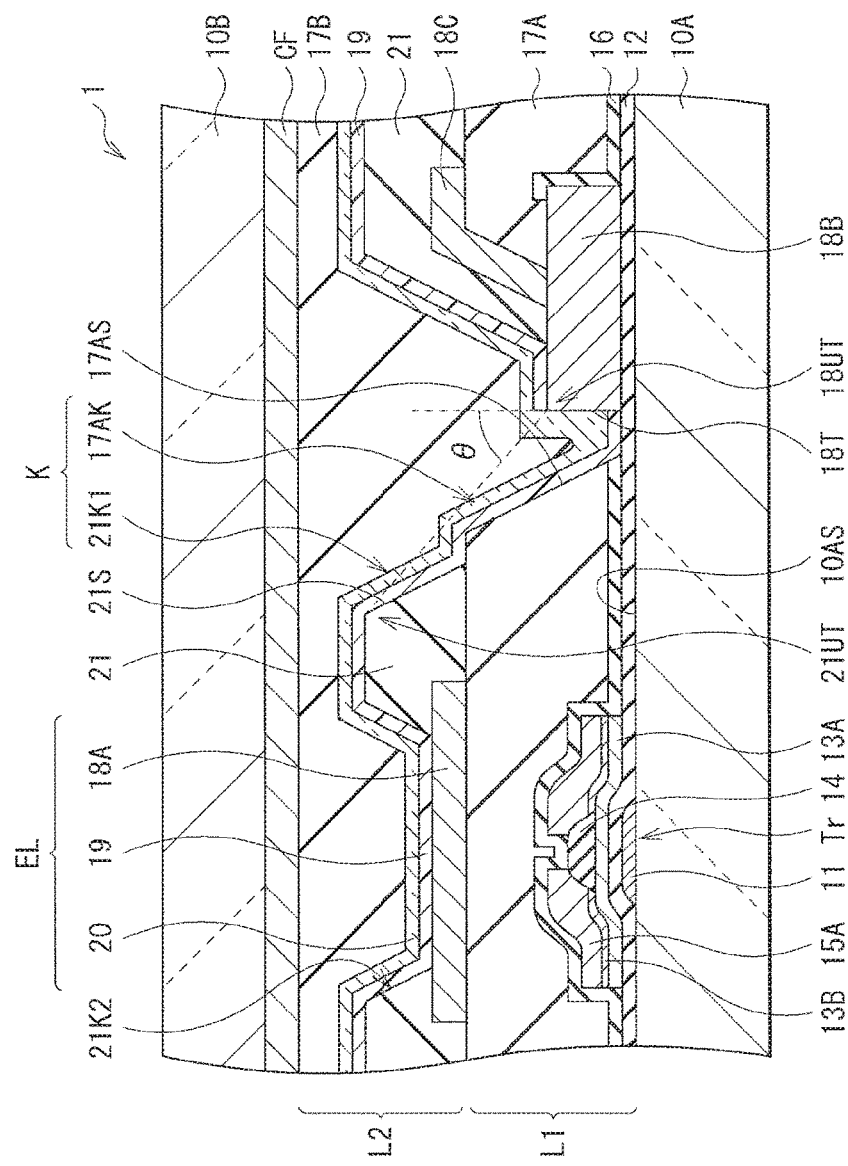
[FIG. 4]

[ FIG. 5A ]
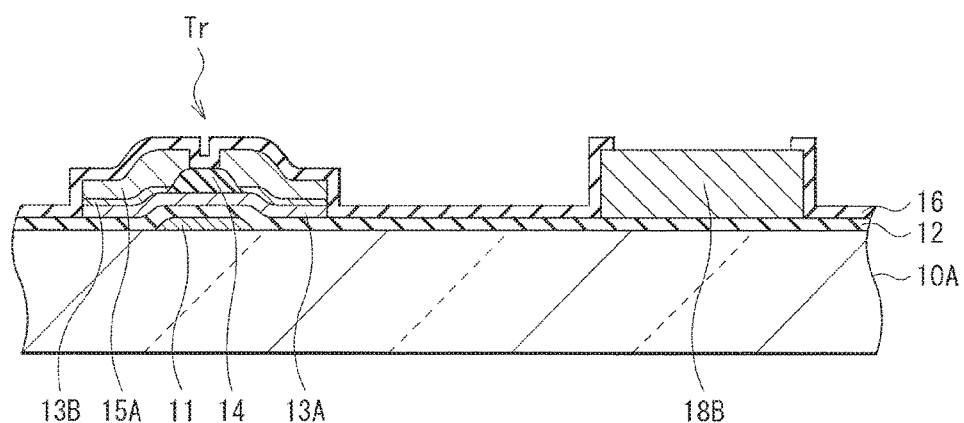
[ FIG. 5B ]
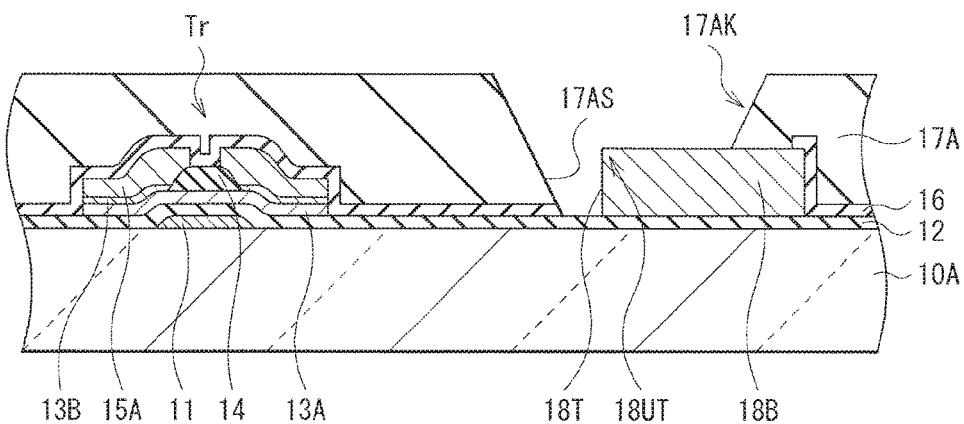

[ FIG. 5C ]
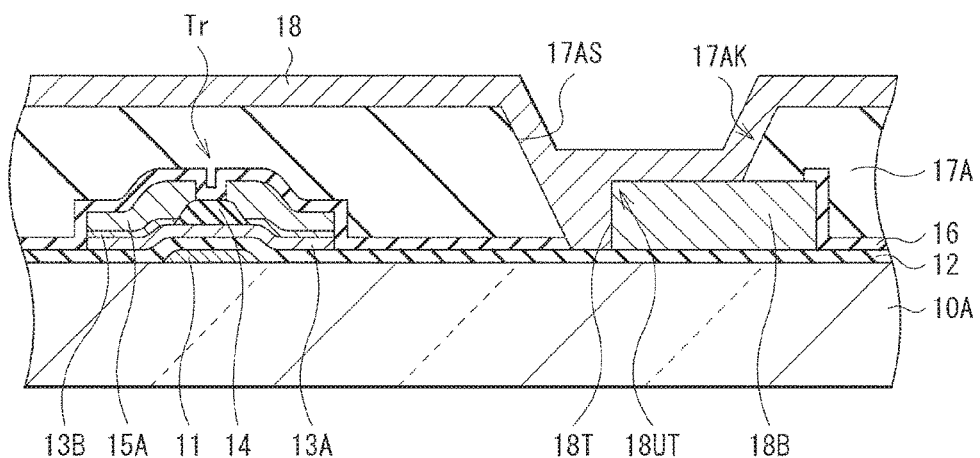
[ FIG. 5D ]
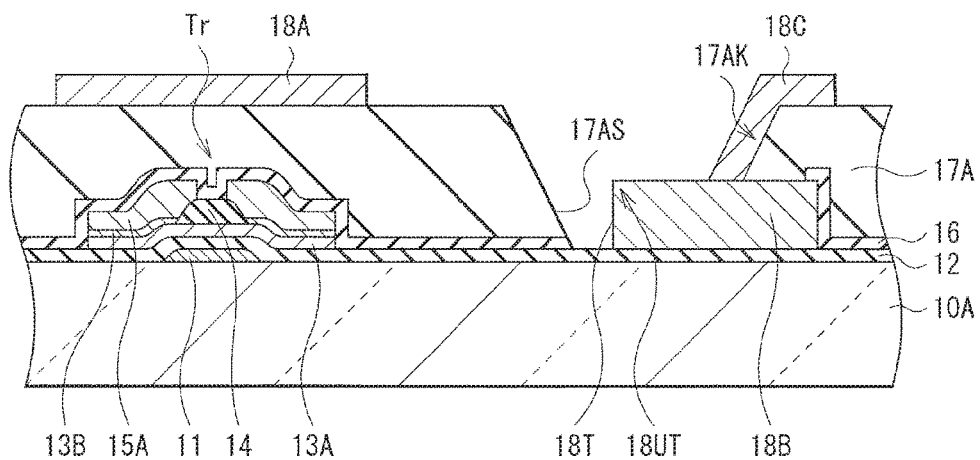

[ FIG. 5E ]
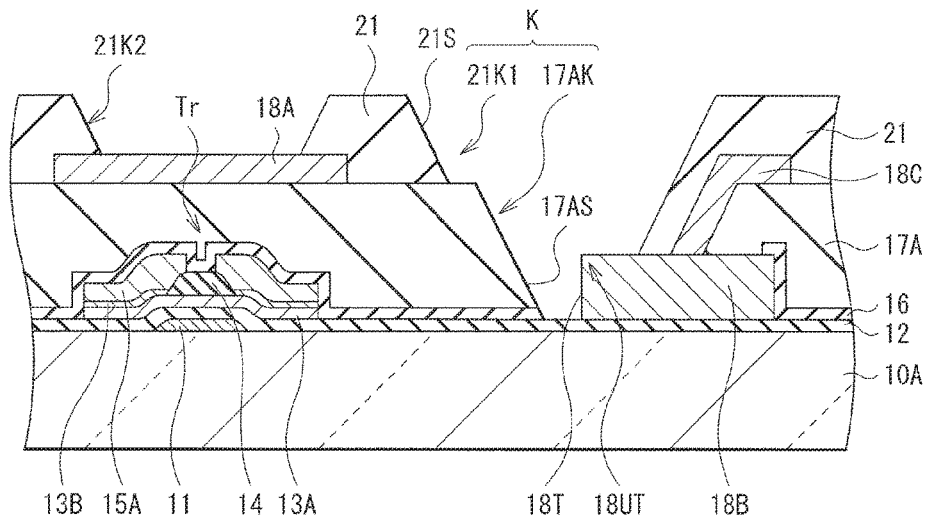
[ FIG. 5F ]
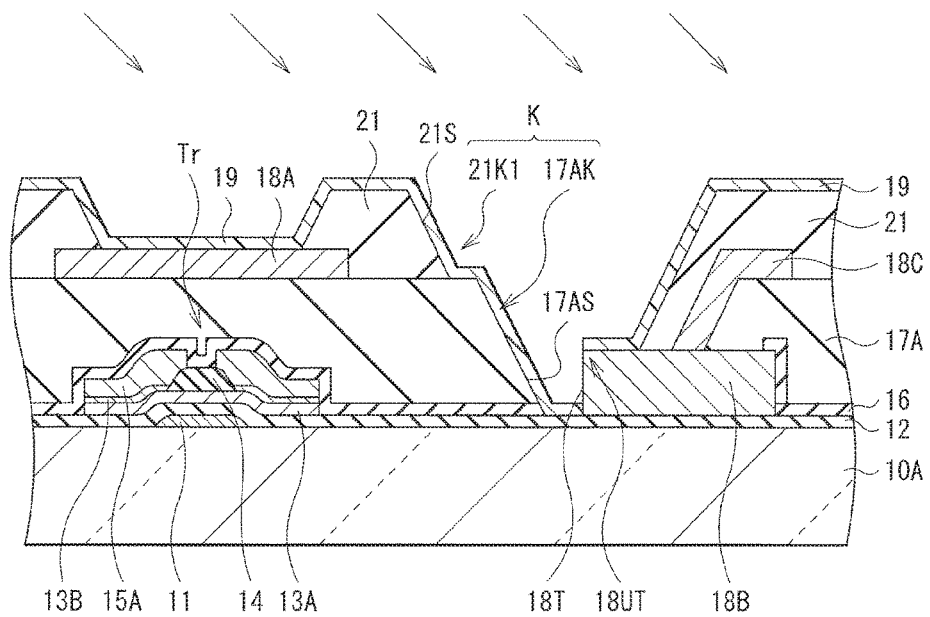

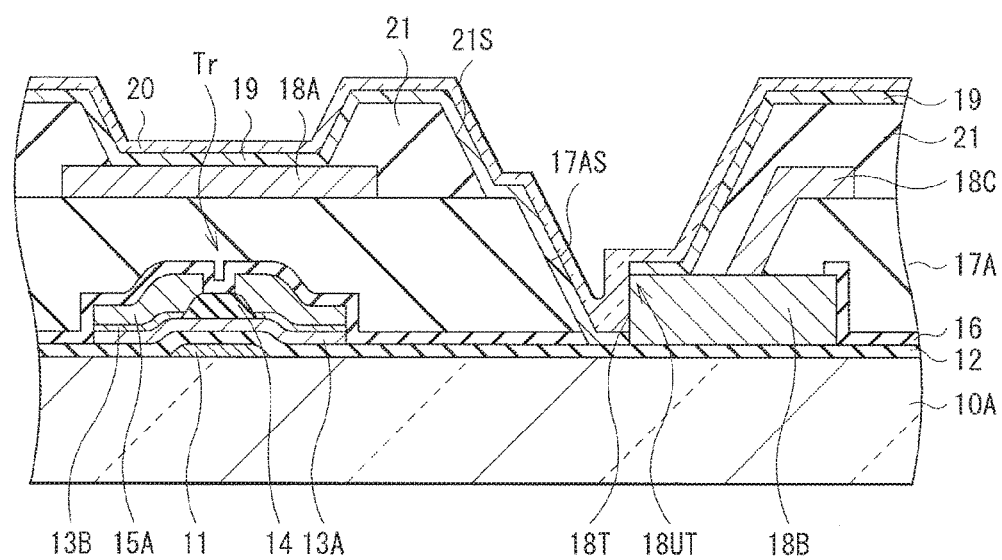
[ FIG. 5G ]

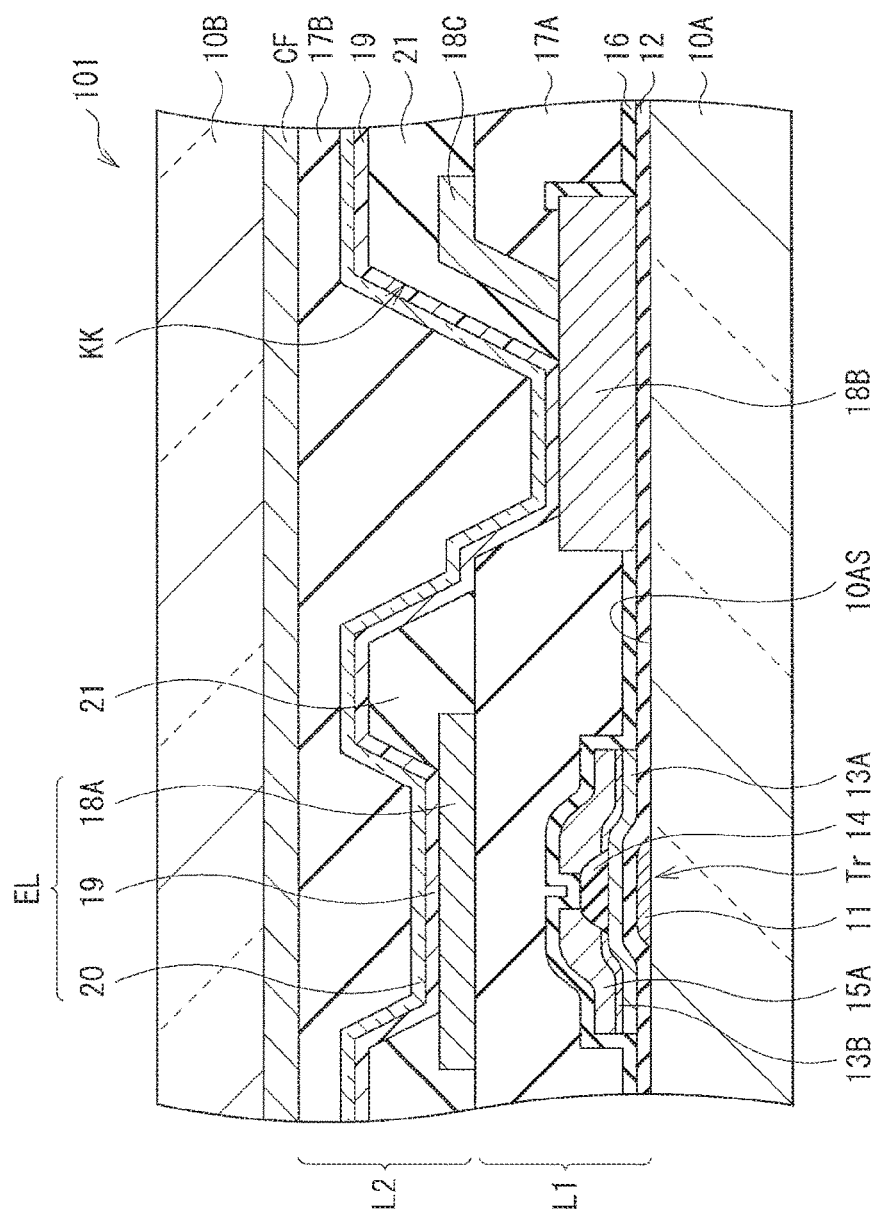
[FIG. 6A]

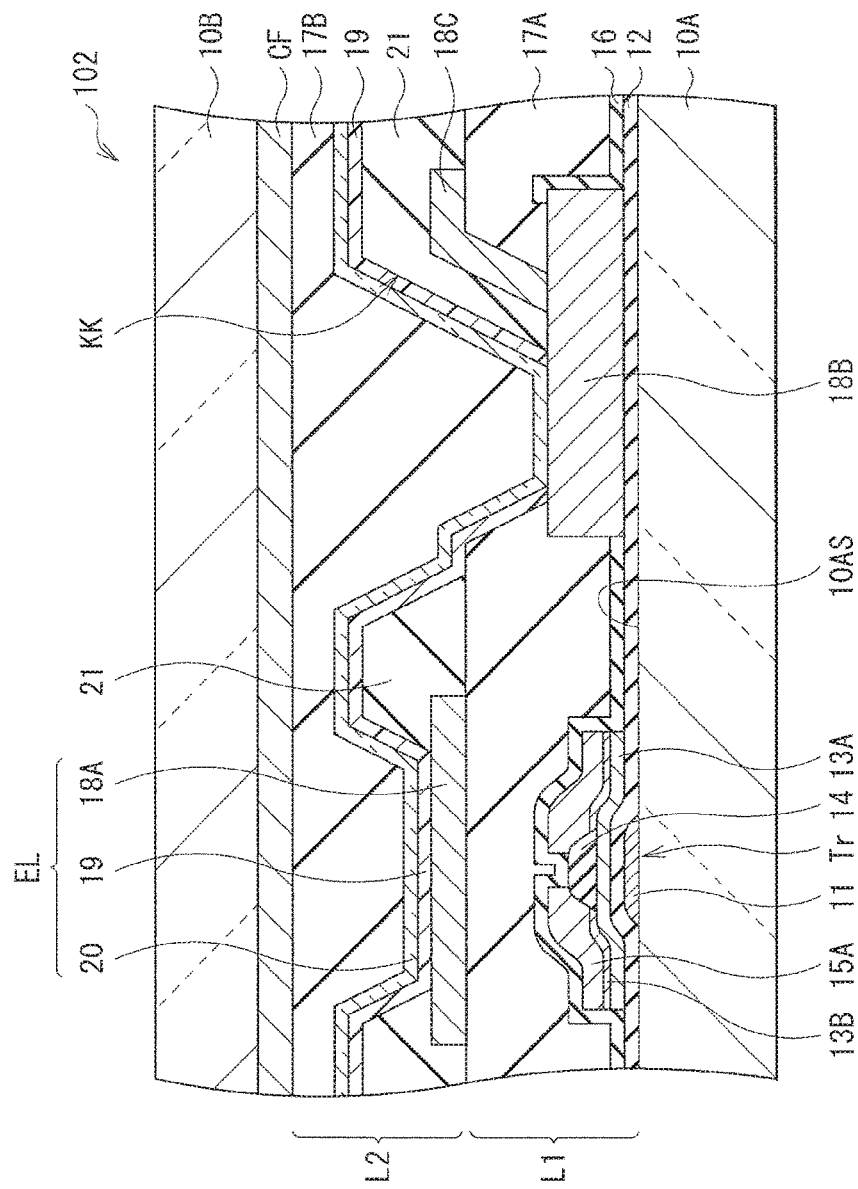
[FIG. 6B]

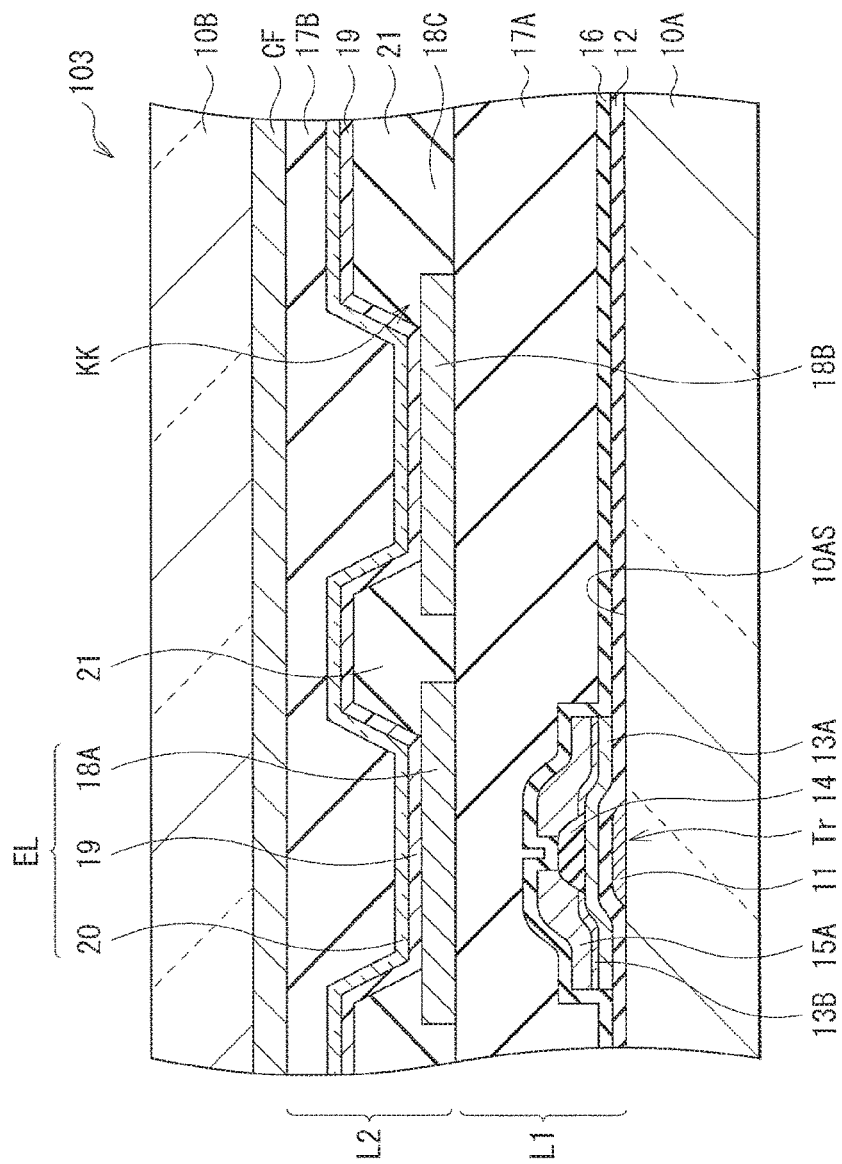

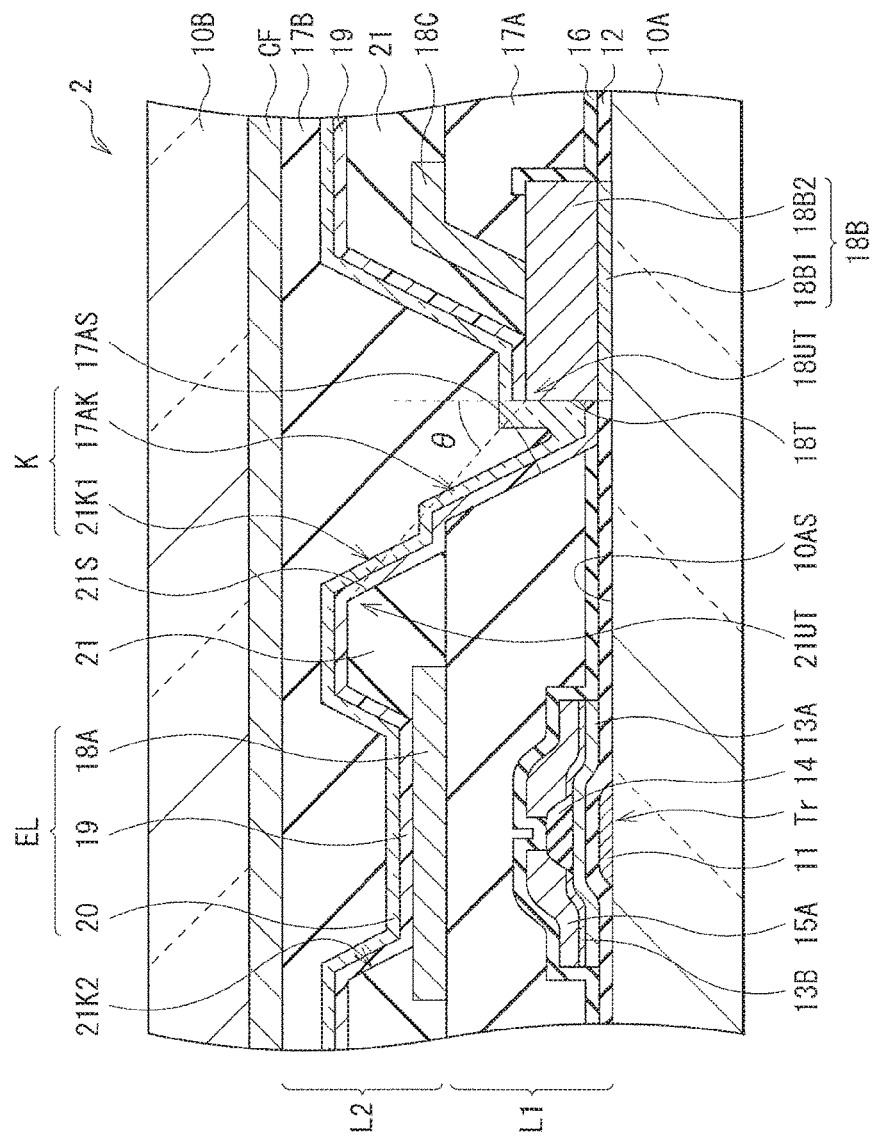
[FIG. 7]

[ FIG. 8 ]
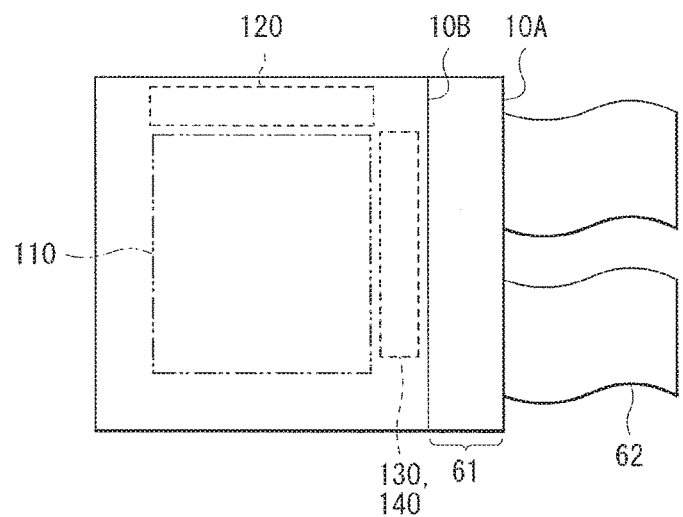
[ FIG. 9 ]
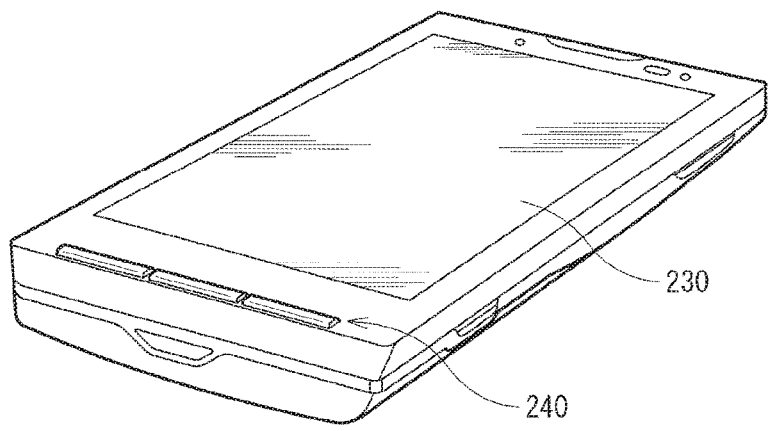

DISPLAY DEVICE HAVING AN AUXILIARY ELECTRODE ON THE SUBSTRATE WITH AN END SURFACE CONTACTING AN ELECTRODE OF THE ORGANIC LIGHT EMITTING ELEMENT

CROSS REFERENCE TO RELATED APPLICATIONS

This application is a U.S. National Phase of International Patent Application No. PCT/JP2015/075572 filed on Sep. 9, 2015, which claims priority benefit of Japanese Patent Application No. JP 2014-192786 filed in the Japan Patent Office on Sep. 22, 2014. Each of the above-referenced applications is hereby incorporated herein by reference in its entirety.

TECHNICAL FIELD

The disclosure relates to a display device having an organic light-emitting element, a method of manufacturing the display device, and an electronic apparatus provided with the display device.

BACKGROUND ART

In recent years, an organic EL (Electro Luminescence) display device that utilizes an organic EL phenomenon to display an image has been attracting attention.

For the organic EL display device, there are a lower surface light emission (bottom emission) system in which light from each organic EL element is emitted to the drive panel side, and an upper surface light emission (top emission) system in which conversely the light is emitted to the sealing panel side. The latter has been the mainstream of development owing to its capability of allowing an aperture ratio to be increased.

Now, in the upper surface light emission system organic EL display device, an electrode on light extracting side, that is, the sealing panel side is an electrode common to each organic EL element, and is configured by a light-transmitting conductive material such as ITO (Indium Tin Oxide). However, such a light-transmitting conductive material has a resistivity which is about 2 to 3 orders of magnitude higher than, for example, an ordinary metal material. Hence, there has been an issue that, since a voltage applied to the electrode on the light extracting side becomes non-uniform within a plane, a positional variation occurs in light emission luminance among each of the organic EL elements and display quality ends up lowering.

Accordingly, the applicant of the present application has disclosed a technique in which a low resistance auxiliary wiring line and the light extracting side electrode are connected via a conductive contact part (refer to Patent Literature 1, for example).

CITATION LIST

Patent Literature

Patent Literature 1:
Japanese Unexamined Patent Application Publication No. 2012-230928

SUMMARY OF INVENTION

The technique disclosed in the above-described Patent Literature 1, however, involves a necessity to perform differentiated application that uses a vapor deposition mask in a manufacturing step thereof. Therefore, there is a possibility that such a manufacturing step will be an obstacle in terms of achieving further increased integration or miniaturization in the organic EL display device.

Therefore, it is desirable to provide a display device that is more suited to increase in integration and able to exhibit good display performance, a method of manufacturing the display device, and an electronic apparatus provided with the display device.

A display device according to an embodiment of the disclosure includes: a base; an organic light-emitting element including a stacked structure, in which the stacked structure has a first electrode layer, an organic light-emitting layer, and a second electrode layer that are stacked in order on the base; a drive element that is provided on the base, and drives the organic light-emitting element; and an auxiliary electrode layer provided on the base, and including an end surface that is in contact with the second electrode layer. Moreover, an electronic apparatus according to an embodiment of the disclosure includes the above-described display device.

A method of manufacturing a display device according to an embodiment of the disclosure includes each of the following operations <1> to <7>.

<1> Forming, on a base, a drive element and an auxiliary electrode layer.
<2> Forming a first insulating layer so as to cover the drive element and the auxiliary electrode layer.
<3> Forming a first opening on a portion of the first insulating layer to expose an end surface of the auxiliary electrode layer.
<4> Selectively forming a first electrode layer on the first insulating layer.
<5> Forming a second insulating layer on the first insulating layer, in which the second insulating layer has a second opening at a position that corresponds to the first electrode layer and a third opening at a position that corresponds to the auxiliary wiring line layer, and the third opening is in communication with the first opening.
<6> Forming an organic light-emitting layer so as to cover the first electrode layer without covering the end surface of the auxiliary wiring line layer.
<7> Forming a second electrode layer so as to cover both the organic light-emitting layer and the end surface of the auxiliary wiring line layer.

In the display device, the method of manufacturing the display device, and the electronic apparatus according to an embodiment of the disclosure, the second electrode layer is in contact with the end surface of the auxiliary wiring line layer. Hence, contact resistance is sufficiently reduced even in a minute region.

The display device, the method of manufacturing the display device, and the electronic apparatus according to an embodiment of the disclosure are thus able to exhibit good display performance while achieving a high level of integration. Note that effects of the disclosure are not limited to these, and may be any of the effects in the description below.

BRIEF DESCRIPTION OF DRAWINGS

FIG. 1 is a schematic view illustrating an overall configuration of a display device according to an embodiment of the disclosure.

FIG. 2 is a view illustrating an example of a pixel drive circuit illustrated in FIG. 1.

FIG. 3 is a plan view illustrating an example of a display region illustrated in FIG. 1.

FIG. 4 is a cross-sectional view illustrating a cross section taken along the line IV-IV illustrated in FIG. 3.

FIG. 5A is a cross-sectional view illustrating a step of a method of manufacturing the display device illustrated in FIG. 1.

FIG. 5B is a cross-sectional view illustrating a step following FIG. 5A.

FIG. 5C is a cross-sectional view illustrating a step following FIG. 5B.

FIG. 5D is a cross-sectional view illustrating a step following FIG. 5C.

FIG. 5E is a cross-sectional view illustrating a step following FIG. 5D.

FIG. 5F is a cross-sectional view illustrating a step following FIG. 5E.

FIG. 5G is a cross-sectional view illustrating a step following FIG. 5F.

FIG. 6A is a cross-sectional view illustrating a key part configuration of a display device according to a first reference example.

FIG. 6B is a cross-sectional view illustrating a key part configuration of a display device according to a second reference example.

FIG. 6C is a cross-sectional view illustrating a key part configuration of a display device according to a third reference example.

FIG. 7 is a cross-sectional view illustrating a key part configuration of a display device according to a first modified example.

FIG. 8 is a plan view illustrating a schematic configuration of a module including the display device illustrated in FIGS. 1 and 7.

FIG. 9 is a perspective view illustrating an external appearance of a smartphone according to an application example of the display device illustrated in FIGS. 1 and 7.

DESCRIPTION OF EMBODIMENTS

Embodiments of the disclosure will be described in detail below with reference to the drawings. Note that description will be given in the following order.
1. Embodiment (display device of basic configuration)
2. Modified Example
3. Application Example
4. Experiment Examples 1. Embodiment

[Configuration of Display Device 1]

An organic EL display device 1 (hereafter, referred to simply as display device 1) according to an embodiment in the disclosure will be described with reference to FIGS. 1 to 4. FIG. 1 illustrates an overall configuration of the display device 1. The display device 1 is employed as, for example, an ultra-thin type organic EL color display device. For example, the display device 1 has a configuration in which a display region 110 is formed on a transparent substrate 10A, and in which a signal line drive circuit 120 and a scanning line drive circuit 130 as drivers for image display are formed in a periphery of the display region 110. The display region 110 includes a later-described plurality of organic EL elements EL that are disposed in matrix.

A pixel drive circuit 140 is formed within the display region 110. FIG. 2 illustrates an example of the pixel drive circuit 140. The pixel drive circuit 140 is formed in a layer below a later-described first electrode 18A, that is, between the substrate 10A and the first electrode 18A. The pixel drive circuit 140 is an active drive circuit that includes: a drive transistor Tr1 and a write transistor Tr2; a capacitor (holding capacitor) Cs between those transistors; and the organic EL element EL. The organic EL element EL is connected in series to the drive transistor Tr1 between a first power supply line (Vcc) and a second power supply line (GND). The drive transistor Tr1 and the write transistor Tr2 are configured by a general thin film transistor (TFT (Thin Film Transistor)). The drive transistor Tr1 and the write transistor Tr2 have, for example, an inverse stagger structure (each may be of a so-called bottom gate type). However, the drive transistor Tr1 and the write transistor Tr2 may also have a stagger structure (each may be of a top gate type).

The pixel drive circuit 140 includes, for example, a plurality of signal lines 120A extending in a column direction and a plurality of scanning lines 130A extending in a row direction. One of the plurality of organic EL elements EL (a subpixel) is provided corresponding to each of intersections of each of the signal lines 120A and each of the scanning lines 130A. Each signal line 120A is connected to the signal line drive circuit 120. An image signal is supplied from the signal line drive circuit 120 to a source electrode of the write transistor Tr2 via the signal line 120A. Each scanning line 130A is connected to the scanning line drive circuit 130. A scanning signal is sequentially supplied from the scanning line drive circuit 130 to a gate electrode of the write transistor Tr2 via the scanning line 130A.

FIG. 3 illustrates a plan configuration of the display region 110 of the display device 1. FIG. 4 illustrates a cross-sectional configuration taken along the line IV-IV as viewed in the direction of the arrows in FIG. 3.

As illustrated in FIG. 4, the display device 1 has a structure that includes a first level L1 and a second level L2 stacked in order between a pair of insulating substrates 10A and 10B. For example, the first level L1 includes a thin film transistor Tr, and the second level L2 includes the organic EL element EL. The thin film transistor Tr has a configuration in which a gate electrode 11, a gate insulating film 12, a silicon film 13A, a stopper insulating film 14, an n+ amorphous silicon film 13B, and a wiring line layer 15A are stacked in order on the substrate 10A. The wiring line layer 15A acts as a source electrode and a drain electrode. Furthermore, a protective insulating film (passivation film) 16 and a planarizing insulating film 17A are stacked in order on the thin film transistor Tr. The protective insulating film 16 has insulating properties. The organic EL element EL is formed on the planarizing insulating film 17A.

The substrates 10A and 10B are each configured by a transparent insulating material such as a glass material and a plastic material, for example.

The thin film transistors Tr are the drive transistors Tr1 for driving and thereby causing light emission in the respective organic EL elements EL. Of this, the gate electrode 11 is configured by molybdenum (Mo), for example. Moreover, the silicon film 13A is a portion that forms a channel region of the thin film transistor Tr, and is configured by an amorphous silicon film, for example.

The wiring line layer 15A configures the source electrode and the drain electrode of the thin film transistor Tr, and also functions as a wiring line such as a signal line. Examples of constituent materials of the wiring line layer 15A include titanium (Ti), titanium nitride (TiN), Al, Mo, tungsten (W), chromium (Cr), gold (Au), platinum (Pt), copper (Cu), ITO, IZO (Indium Zinc Oxide), silver (Ag), and alloys whose key components are these metal materials.

Moreover, the wiring line layer 15A may have a stacked structure such as Mo/Al/Ti, Mo/(AlSi alloy)/Ti, Mo/(AlSiCu alloy)/Ti, and Mo/(AlCe(cerium) alloy/Ti.

The protective insulating film 16 is for protecting the thin film transistor Tr, and is configured by an insulating material that includes one or more of SiO2, SiN, and SiON, for example. Moreover, the planarizing insulating film 17A is for planarizing a layer structure to form thereon the organic EL element EL, and is configured by an insulating material such a polyimide resin, a polybenzoxazole resin, a novolak resin, polyhydroxystyrene, and an acrylic resin that are photosensitive.

Each organic EL element EL has a stacked structure in which the first electrode 18A, an organic light-emitting layer 19, and a second electrode 20 are stacked in order on the planarizing insulating film 17A. Of these, the first electrode 18A and the organic light-emitting layer 19 are separated from each other by an inter-electrode insulating film 21 on the planarizing insulating film 17A, and are disposed in a matrix in the substrates 10A and 10B by a rectangular shape as illustrated in FIG. 3, for example. On the other hand, the second electrode 20 is an electrode common to each of the organic EL elements EL, and is formed uniformly within the substrates 10A and 10B as illustrated in FIG. 4. Note that the inter-electrode insulating film 21 is configured by an insulating material such as a photosensitive polyimide resin. For example, a protective film (not illustrated) is formed uniformly on the second electrode 20 of the organic EL element EL, and a sealing resin 17B is formed uniformly between layers of the protective film (not illustrated) and the transparent substrate 10B. With this configuration, the display device 1 is configured such that light emitted from the organic light-emitting layer 19 is finally emitted from second electrode 20 side (substrate 10B side), that is, from an upper part, forming a so-called upper surface light emission structure.

The first electrode 18A is an electrode (anode electrode or cathode electrode) for applying a voltage to the organic light-emitting layer 19, and also functions as a reflecting electrode for reflecting the light derived from the organic light-emitting layer 19 to be guided upwardly. Hence, the first electrode 18A is configured by, for example, a metal having high reflectivity such as Al, or an alloy whose principle component is Al such as an AlNd (neodymium) alloy and an AlCe alloy. Note that a constituent material of such a first electrode 18A has a nature (surface oxidizability) that its surface is easily oxidized.

The organic light-emitting layer 19 has a configuration in which an unillustrated hole transport layer, light-emitting layer, and electron transport layer are deposited sequentially, and is sandwiched by the first electrode 18A and the second electrode 20. Moreover, when a certain voltage is applied between the first electrode 18A and the second electrode 20, light emission is achieved by carrier recombination of holes and electrons injected into the light-emitting layer.

The light-emitting layer is for white light emission, for example, and includes a stacked body of, for example, a red light-emitting film, a green light-emitting film, and a blue light-emitting film (none of which are illustrated). The red light-emitting film, the green light-emitting film, and the blue light-emitting film are applied with an electric field, whereby some of holes injected from the first electrode 18A via a hole injection layer and the hole transport layer and some of electrons injected from the second electrode 20 via an electron injection layer and the electron transport layer recombine. This allows the red light-emitting film, the green light-emitting film, and the blue light-emitting film to respectively emit red light, green light, and blue light.

The red light-emitting film includes, for example, at least one of a red light-emitting material, a hole transporting material, an electron transporting material, and a positive-negative-charge transporting material. The red light-emitting material may be fluorescent or phosphorescent. The red light-emitting film is configured by, for example, 4,4-bis(2, 2-diphenylvinyn)biphenyl (DPVBi) into which 30% by weight of 2,6-bis[(4'-methoxydiphenylamino)styryl]-1,5-dicyanonaphthalene (BSN) is mixed.

The green light-emitting film includes, for example, at least one of a green light-emitting material, a hole transporting material, an electron transporting material, and a positive-negative-charge transporting material. The green light-emitting material may be fluorescent or phosphorescent. The green light-emitting film is configured by, for example, DPVBi into which 5% by weight of coumarin 6 is mixed.

The blue light-emitting film includes, for example, at least one of a blue light-emitting material, a hole transporting material, an electron transporting material, and a positive-negative-charge transporting material. The blue light-emitting material may be fluorescent or phosphorescent. The blue light-emitting film is configured by, for example, DPVBi into which 2.5% by weight of 4,4'-bis[2-{4-(N,N-diphenylamino)phenyl}vinyl]biphenyl (DPAVBi) is mixed.

The second electrode 20 also is an electrode (anode electrode or cathode electrode) for applying a voltage to the organic light-emitting layer 19. The second electrode 20 is a transparent or translucent electrode in order to allow light derived from the organic light-emitting layer 19 to pass therethrough and emitted upwardly. Hence, the second electrode 20 is configured by a transparent material such as ITO and IZO, or a translucent material such as an MgAg alloy, Cu, Ag, Mg, and Al. Therefore, light transmittance of the second electrode 20 is higher than light transmittance of a later-described auxiliary electrode layer 18B. Moreover, the second electrode 20 is formed by, for example, a sputter deposition method.

As illustrated in FIGS. 3 and 4, the auxiliary electrode layer 18B is further provided in a region between adjacent first electrodes 18A. The auxiliary electrode layer 18B is provided in the first level L1 that includes the thin film transistor Tr, and its end surface 18T is in contact with the second electrode 20 as described later (refer to FIG. 4). The auxiliary electrode layer 18B is formed on the gate insulating film 12 that covers a surface 10AS of the substrate 10A, for example. The auxiliary electrode layer 18B is formed by, for example, a vacuum vapor deposition method. In-plane non-uniformity of an electrode voltage in the second electrode 20 is relieved by the auxiliary wiring line layer 18B being electrically connected to the second electrode 20. Therefore, it is desirable that conductivity of the auxiliary electrode layer 18B be higher than conductivity of the second electrode 20. Specifically, the auxiliary electrode layer 18B has the same configuration as a configuration of the wiring line layer 15A of the thin film transistor Tr, for example. Therefore, light transmittance of the second electrode 20 is higher than light transmittance of the auxiliary electrode layer 18B, for example.

A thickness of the auxiliary electrode layer 18B is, for example, larger than a thickness of the organic light-emitting layer 19. If the thickness of the organic light-emitting layer 19 is assumed to be, for example, at most about 400 nm, then the thickness of the auxiliary electrode layer 18B may preferably be, for example, 450 nm or more. Moreover, the end surface 18T of the auxiliary electrode layer 18B is perpendicular to the surface 10AS of the substrate 10A or extends in an overhanging fashion in a direction of increasing distance from the substrate 10A (that is, upwardly). The auxiliary wiring line layer 18B is covered with the planarizing insulating film 17A and the inter-electrode insulating film 21. However, an opening K of forward tapered shape whose width increases the closer the substrate 10B is approached from the substrate 10A, is provided on a region (refer to FIG. 4) corresponding to a portion of the auxiliary wiring line layer 18B, of the planarizing insulating film 17A and the inter-electrode insulating film 21. The opening K has a configuration in which an opening 21K1 formed on the inter-electrode insulating film 21 and an opening 17AK formed on the planarizing insulating film 17A are in communication with each other. The auxiliary wiring line layer 18B is exposed from a bottom part of the opening K, and the end surface 18T of the auxiliary wiring line layer 18B is in contact with the second electrode 20. The organic light-emitting layer 19 is not formed on the end surface 18T of the auxiliary electrode layer 18B. The end surface 18T is covered with the second electrode 20. That is, the second electrode 20 is commonly provided for all of the organic EL elements EL so as to entirely cover the display region 110. In addition, an angle θ formed by a straight line and a direction that is perpendicular to the surface 10AS of the substrate 10A may preferably be 45° or less. The straight line joins an upper edge 21UT and an upper edge 18UT of the end surface 18T. The upper edge 21UT faces the end surface 18T of the auxiliary electrode layer 18B in the opening 21K1 of the inter-electrode insulating film 21. Such an angle more reliably prevents the organic light-emitting layer 19 from being attached to the end surface 18T when the display device 1 is formed. Moreover, an opening 21K2 is formed on a region corresponding to the first electrode 18A, of the inter-electrode insulating film 21.

A color filter layer CF is provided between the sealing resin 17B and the substrate 10B. The color filter layer CF includes, for example, three colors of filters, that is, a red (R) filter, a green (G) filter, and a blue (B) filter. Each of the organic EL elements EL is assigned with any one of the red filter, the green filter, or the blue filter. As a result, white light derived from the organic light-emitting layer 19 passes through the red filter, the green filter, or the blue filter to be converted into red light, green light, or blue light, following which the thus-converted pieces of light are emitted to the outside via the substrate 10B.

Next, a method of manufacturing the display device 1 will be described with reference to FIGS. 5A to 5G. FIGS. 5A to 5G are each a cross-sectional view illustrating a portion of a manufacturing step of the organic EL display device 1.

First, as illustrated in FIG. 5A, the gate electrode 11, the gate insulating film 12, the silicon film 13A, the stopper insulating film 14, the n+ amorphous silicon film 13B, and the wiring line layer 15A are stacked in this order on the substrate 10A configured by the previously mentioned materials, using, for example, a sputtering method, a CVD (Chemical Vapor Deposition) method, and a photolithography method, to thereby form the plurality of thin film transistors Tr disposed in a matrix, for example.

Now, upon formation of the wiring line layer 15A by the sputtering method, for example, the auxiliary electrode layer 18B having the same stacked structure as the wiring line layer 15A may preferably be formed together on the gate insulating film 12, using the same material as the wiring line layer 15. A formation position of the auxiliary electrode layer 18B is a region between the adjacent first electrodes 18A as illustrated in FIG. 3. Note that each of materials of the wiring line layer 15A and the auxiliary electrode layer 18B is selected as necessary depending on an etching method of a later-described metal layer 18. For example, when formation of the wiring line layer 15A and the auxiliary electrode layer 18B are to be performed by wet etching using a mixed acid of phosphoric acid, nitric acid, and acetic acid as described later, the wiring line layer 15A and the auxiliary electrode layer 18B each may be a multi-layer film of Ti/Al/Ti. In this case, film thicknesses may be about 200 nm/500 nm/200 nm for Ti/Al/Ti, for example.

After the thin film transistor Tr and the auxiliary electrode layer 18B are formed, the protective insulating film 16 is formed uniformly by a CVD method, for example, so as to cover the thin film transistor Tr and auxiliary electrode layer 18B. However, it is preferable that a portion of an upper surface of the auxiliary electrode layer 18B be exposed.

Next, as illustrated in FIG. 5B, the planarizing insulating film 17A is uniformly applied and thus formed on the protective insulating film 16 by, for example, a spin coating method or a slit coating method. Thereafter, the planarizing insulating film 17A in a region corresponding to the auxiliary electrode layer 18B undergoes exposure and development by, for example, a photolithography method, following which baking is further performed to thereby form the opening 17AK having an inclined surface 17AS of forward tapered shape. At this time, the planarizing insulating film 17A and the protective insulating film 16 near the end surface 18T of the auxiliary electrode layer 18B are removed so that the end surface 18T is exposed. Note that an angle of inclination of the inclined surface 17AS of the forward tapered shaped opening 17AK is set as necessary depending on a film thickness or method of formation of the later-formed second electrode 20.

Next, as illustrated in FIG. 5C, the metal layer 18 is formed uniformly on the planarizing insulating film 17A and the auxiliary electrode layer 18B by, for example, a sputtering method. For example, the previously-mentioned constituent materials of the first electrode 18A and an auxiliary electrode layer 18C may be used (in this example, a metal material).

Thereafter, as illustrated in FIG. 5D, the first electrode 18A and the auxiliary electrode layer 18C having shapes illustrated in FIGS. 3 and 4 are each formed by selectively etching the metal layer 18 by, for example, a photolithography method. At this time, the first electrodes 18A are formed at positions corresponding to the respective thin film transistors Tr. Moreover, patterning is performed such that a portion of the auxiliary electrode layer 18C is electrically connected to the auxiliary electrode layer 18B. Here, the auxiliary electrode layer 18B is configured of a material having high etching selectivity to the metal layer 18. This prevents the auxiliary electrode layer 18B from being etched together when etching the metal layer 18. Note that etching at this time is performed by the wet etching using a mixed acid of phosphoric acid, nitric acid, and acetic acid, for example.

Next, as illustrated in FIG. 5E, the inter-electrode insulating film 21 configured by the previously-mentioned material is uniformly applied and thus formed on the planarizing insulating film 17A, the first electrode 18A, and the auxiliary electrode layers 18B and 18C by, for example, a spin coating method or a slit coating method. The thus-formed inter-electrode insulating film 21 is patterned in a predetermined shape by, for example, a photolithography method such that the first electrodes 18A are separated from each other. Moreover, at this time, a region corresponding to the auxiliary electrode layer 18B is selectively removed by, for example, a photolithography method, and the opening 21K1 having a forward tapered shaped side surface is formed. This forms the opening K having the opening 21K1 and the opening 17AK that are in communication with each other. At this time, a side surface including an inclined surface 21S and the inclined surface 17AS, of the opening K may be formed so as to have a stepped shape, or the side surface of the opening K may be so formed as to be stepless. In addition, the angle θ formed by the straight line and the direction that is perpendicular to the surface 10AS of the substrate 10A may preferably be 45° or less. The straight line joins the upper edge 21UT and the upper edge 18UT of the end surface 18T. The upper edge 21UT faces the end surface 18T of the auxiliary electrode layer 18B in the opening 21K1 of the inter-electrode insulating film 21. This is in order to more reliably prevent attachment of the organic light-emitting layer 19 to the end surface 18T when the organic light-emitting layer 19 is formed. Moreover, in conjunction with the formation of the opening 21K1, the region corresponding to the first electrode 18A is likewise selectively removed to form the opening 21K2 having a forward tapered shaped side surface.

Next, as illustrated in FIG. 5F, the organic light-emitting layer 19 is formed on each of the first electrodes 18A by, for example, a vacuum vapor deposition method. At this time, although the organic light-emitting layer 19 is formed also on the inter-electrode insulating film 21, the organic light-emitting layer 19 is not formed on the end surface 18T of the auxiliary electrode layer 18B. This is because wraparound of an organic material is difficult to occur and thus attachment of the organic material is difficult to occur owing to the end surface 18T of the auxiliary electrode layer 18B which is a steeply inclined surface. Moreover, the organic light-emitting layer 19 covering the gate insulating film 12 and the organic light-emitting layer 19 covering the upper surface of the auxiliary electrode layer 18B are reliably separated. This is because the thickness of the auxiliary electrode layer 18B is larger than the thickness of the organic light-emitting layer 19. In contrast, the upper surface of the first electrode 18A exposed as a bottom surface of the opening 21K2 is entirely covered with the organic light-emitting layer 19.

Thereafter, as illustrated in FIG. 5G, the second electrode 20 configured by the previously-mentioned material is formed uniformly by, for example, a sputter deposition method so as to cover the whole. At this time, the second electrode 20 is formed so as to cover also the end surface 18T of the auxiliary electrode layer 18B on which the organic light-emitting layer 19 has not been formed. This is because wraparound to a side surface of a target to be subjected to sputter deposition (here, the planarizing insulating film 17A and the inter-electrode insulating film 21) is easier for an inorganic material constituting the second electrode 20 than for an organic material. Moreover, the second electrode 20 is formed also on the organic light-emitting layer 19 that covers the opening 21K2, whereby the organic EL element EL is obtained.

Finally, the protective film 23 configured by the previously-mentioned material is formed uniformly on the second electrode 20 by, for example, a CVD method. Further, the sealing resin 17B is formed uniformly on the protective film 23 by, for example, a drop injection method. The thus-formed sealing resin 17B is interposed by the substrate 10B configured by the previously-mentioned material, whereby the display device 1 of the present embodiment illustrated in FIGS. 1 and 2 is manufactured.

[Operation of Display Device 1]

In the display device 1, when a voltage is applied to the first electrode 18A via the wiring line layer 15A and the thin film transistor Tr, the organic light-emitting layer 19 emits light with a luminance corresponding to a potential difference between the first electrode 18A and the second electrode 20. The light derived from the organic light-emitting layer 19 passes through the second electrode 20 while being reflected by the first electrode 18A to be emitted upwardly, i.e., to be emitted from the substrate 10B. Moreover, light corresponding to a pixel signal is emitted from the organic EL element EL disposed in each pixel, whereby a certain image is displayed in the organic EL display device 1. Here, each of the organic EL elements EL is assigned with any one of the red filter, the green filter, and the blue filter, for example. As a result, the white light emitted from the organic light-emitting layer 19 in each of the organic EL elements EL is converted to any one of the red light, the green light, or the blue light to be emitted from the substrate 10B.

[Workings and Effects of Display Device 1]

In one organic EL display device, a light-emitting layer configured by any of organic light-emitting materials that allow for emission of pieces of light of respective colors undergo differentiated application for each of the organic EL elements to obtain a different emission light color for each of the organic EL elements. In this case, it is necessary to perform patterning such that the light-emitting layers configured by the organic light materials that allow for the emission of the pieces of light of respective colors become portions serving as individually-partitioned pixels. A known technology for such patterning is, for example, a vapor deposition method by means of a vacuum process that utilizes a shadow mask for a low molecular organic light-emitting material. For a high polymer organic light-emitting material, a printing technology that uses an ink jet is known. However, these patterning techniques involve limitation in definition and are thus becoming unable to sufficiently address increase in definition and miniaturization of the organic EL elements EL in the display devices of recent years. Therefore, as described above, attention is being attracted by a configuration in which the organic light-emitting layer 19 common to all of the organic EL elements EL is collectively formed over the entire surface of the display region 110, and white light from the organic light-emitting layer 19 is separated into each color by means of the color filter layer CF.

Incidentally, in the upper surface light emission system organic EL display device, resistivity of the material constituting the transparent electrode on the sealing panel side, that is, the second electrode 20, is higher than resistivity of copper or the like as already mentioned. Therefore, in order to reduce variation in light emission luminance in the display region 110 in the present embodiment, the second electrode 20 is connected to the separately-provided auxiliary electrode layer 18B to reduce a voltage drop within a plane of the second electrode 20. However, if an opening KK is simply so formed as to expose the upper surface of the auxiliary electrode layer 18B provided in the first level L1 and the organic light-emitting layer 19 is simply so collectively formed over the entire surface of the display region 110 as to fill the opening KK as in a display device 101 according to a first reference example illustrated in FIG. 6A, then conduction between the second electrode 20 and the auxiliary electrode layer 18 becomes difficult. This is because the upper surface of the auxiliary electrode layer 18B ends up being completely covered with the organic light-emitting layer 19. In this case, the display device 101 involves deficiency of light emission luminance and involves difficulty in performing good quality image display. Therefore, in order to solve an issue, it is necessary to selectively remove a portion of the organic light-emitting layer 19 that covers the upper surface of the auxiliary electrode layer 18 and form the second electrode 20 thereafter as in a display device 102 according to a second reference example illustrated in FIG. 6B. However, since a patterning accuracy is necessary in this case as well, it becomes difficult to address the further increase in definition and miniaturization of each of the organic EL elements EL. Moreover, it also leads to complication of a manufacturing step. Such issues occur similarly in a display device 103 according to a third reference example illustrated by way of example in FIG. 6C as well in which the opening KK is simply formed so as to expose the upper surface of the auxiliary electrode layer 18B provided in the second level L2.

To address these, the display device 1 according to the present embodiment is configured such that the second electrode 20 broadly covering the display region 110 is in contact with the end surface 18T of the auxiliary electrode layer 18B. Adopting such a configuration makes it possible to sufficiently reduce connection resistance in a more-minute region as compared with a case where, for example, the second electrode 20 is in contact with only the upper surface of the auxiliary electrode layer 18B. This is because it is possible to sufficiently secure cross-sectional area of the auxiliary electrode layer 18B and decrease resistance without increasing a dimension in an in-plane direction, that is, a width of the auxiliary electrode layer 18B, owing to the thickness of the auxiliary electrode layer 18B secured in large measure.

Moreover, in the present embodiment, the auxiliary electrode layer 18B is provided in the first level L1 that includes the thin film transistor Tr. As a result, it is possible to sufficiently reduce the connection resistance between the second electrode 20 and the auxiliary electrode layer 18B without involving degradation of light emission performance of the organic EL element EL. If, however, the auxiliary electrode layer 18B is provided in the second level L2 together with the first electrode 18A, for example, then the thickness of the auxiliary electrode layer 18B becomes the same as the thickness of the first electrode 18A. It is better not to increase the thickness of the first electrode 18A in order to secure flatness of the first electrode 18A, because light emission performance of the organic EL element EL lowers if flatness of the first electrode 18A is impaired. Therefore, a width of the auxiliary electrode layer 18B has to be increased in order for cross-sectional area of the auxiliary electrode layer 18B to be sufficiently secured, leading to an increase in occupied area. In contrast, the present embodiment is able to solve such issues by providing the auxiliary electrode layer 18B in the first level L1 to thereby secure a sufficient thickness.

Moreover, in the present embodiment, the auxiliary electrode layer 18B is disposed in the display region 110 that serves as an active area, and the auxiliary electrode layer 18B and the second electrode 20 are connected in the display region 110. This makes it possible to eliminate a so-called bezel region which is necessary in a case where, for example, the auxiliary electrode layer is disposed in a surrounding region of the display region 110 and a potential is applied to the second electrode from the auxiliary electrode layer. Moreover, when the auxiliary electrode layer is disposed in the surrounding region of the display region 110, it is necessary to increase the thickness of the second electrode in order to relieve the voltage drop in the second electrode in a screen that has comparatively large area, leading to a decrease in transmittance of the second electrode. In contrast, in the present embodiment, the auxiliary electrode layer 18B and the second electrode 20 are connected in the display region 110, making it possible to suppress voltage drop in the second electrode 20 while reducing the thickness of the second electrode 20.

In this way, the display device 1 according to the present embodiment is more suited to increase in integration and is able to exhibit good display performance.

Moreover, in order to obtain the display device 1 having such a configuration, the present embodiment involves exposing the end surface 18T of the auxiliary electrode layer 18B upon forming the opening K, forming the organic light-emitting layer 19 selectively by a vacuum vapor deposition method, and forming the second electrode 20 entirely by a sputter deposition method. That is, the present embodiment simply takes advantage of a difference between attachment characteristics of an organic material owing to the vacuum vapor deposition method and attachment characteristics of an inorganic material owing to the sputter deposition method, and does not involve any additional treatment such as a patterning of the formed organic light-emitting layer 19. Therefore, it becomes possible to address further increase definition and miniaturization of the organic EL element EL while achieving simplification of a manufacturing step.

2. Modified Example

[Configuration of Display Device 2]

FIG. 7 illustrates a key part cross-sectional configuration of an organic EL display device (display device 2) according to a modified example of the above-described embodiment. In the above-described display device 1, the configuration of the auxiliary electrode layer 18B included in the first level L1 is made the same as the configuration of the wiring line layer 15A of the thin film transistor Tr. In contrast, the auxiliary electrode layer 18B according to the display device 2 has a stacked structure of a first layer 18B1 and a second layer 18B2. The first layer 18B1 has the same configuration as the gate electrode 11 of the thin film transistor Tr, and the second layer 18B2 has the same configuration as the wiring line layer 15A of the thin film transistor Tr. Otherwise, the configuration is similar to that of the display device 1 according to the first embodiment. Upon forming the display device 2, the first layer 18B1 is collectively formed together with the gate electrode 11, and the second layer 18B2 is collectively formed together with the wiring line layer 15A. However, the gate insulating film 12 covering the first layer 18B1 is removed before forming the second layer 18B2.

[Workings and Effects of Display Device 2]

In the display device 2, the auxiliary electrode layer 18B has a two-layer structure of the first layer 18B1 and the second layer 18B2. Hence, it is possible to increase the thickness of the auxiliary electrode 18B while maintaining overall thickness as compared with the above-described display device 1. As a result, it is possible to increase the cross-sectional area of the auxiliary electrode layer 18B and further reduce the voltage drop of the second electrode 20. Therefore, an even greater improvement in display performance is expectable.

3. Application Example

An example of application to an electronic apparatus of the display device (display devices 1 and 2) as described above will be described below. Examples of the electronic apparatus may include a television, a digital camera, a notebook personal computer, a portable terminal device including a smartphone, and a video camera. That is, the above-described display device is applicable to any electronic apparatus in any field in which an image signal received from the outside or an image signal generated internally is displayed as an image or a picture.

[Module]

The above-described display device is incorporated, as a module as illustrated by way of example in FIG. 8, in a variety of electronic apparatuses, such as that described in a later-described application example. In this module, for example, a region 61 protruding from the substrate 10B is provided on one side of the substrate 10A, and wiring lines of the signal line drive circuit 120, the scanning line drive circuit 130, and a power supply line supply circuit 140 are extended to form an external connection terminal (such as a first peripheral electrode and a second peripheral electrode) in the region 61. The external connection terminal may be provided with a flexible printed circuit (FPC) board 62 for input/output of a signal.

Application Example

FIG. 9 illustrates an external appearance of a smartphone to which the display device of the above-described embodiment is applied. The smartphone includes, for example, a display part 230 and a non-display part 240. The display part 230 is configured by the display device of the above-described embodiment.

4. Experiment Examples

Experiment Example 1

A sample of the display device 1 according to the above-described embodiment was fabricated. Molybdenum was employed here to form the gate electrode 11. The gate insulating film 12 had a two-layer structure of SiO and SiN. The silicon film 13A was formed by amorphous silicon. In addition, the wiring line layer 15A and the auxiliary electrode layer 18B each had a three-layer structure of Ti/Al/Ti. In this three-layer structure, thicknesses of the Ti (titanium) layers were each set to 200 nm, and thicknesses of the Al (aluminum) layers were each set to 600 nm. Furthermore, a total thickness of the planarizing insulating film 17A and the inter-electrode insulating film 21 was set to 6000 nm. Therefore, a distance in a thickness direction from the upper edge 21UT of the inter-electrode insulating film 21 to the upper edge 18UT of the end surface 18T was set to 5000 nm. Moreover, the organic light-emitting layer 19 was formed so as to have a film thickness of 120 nm, by a vacuum vapor deposition method that employs a vapor deposition mask having an opening as a whole. At this time, the end surface 18T was uncovered. Moreover, the second electrode 20 was formed so as to have a film thickness of 150 nm using IZO, by a magnetron sputter deposition method. The protective film 23 was formed using SiNx by a CVD method.

Experiment Example 2

A sample of the display device 101 illustrated in FIG. 6A was fabricated. That is, the opening KK was formed so as to expose only the upper surface of the auxiliary electrode layer 18B, and the organic light-emitting layer 19 and the second electrode 20 were formed so as to entirely cover the inclined surface of that opening KK and the upper surface of the auxiliary electrode layer 18B.

A light emission test of the organic EL element EL was carried out for each of the samples of the above-described experiment examples 1 and 2. As a result, light emission of sufficient luminance was obtained for the sample of experiment example 1, but light emission was not obtained for the sample of experiment example 2.

Although the disclosure has been described in the foregoing with reference to the embodiments, the disclosure is not limited thereto but may be modified in a wide variety of ways. For example, a material and a thickness of each of the layers described in the above-described embodiments are not limited thereto, and any other material and thickness may be adopted.

Moreover, description of the above-described embodiments, etc., has been made by giving an example in which each of the organic light-emitting elements EL emits the white light. However, the technology is not limited thereto. For example, the organic light-emitting elements EL that emit respective pieces of red light, green light, and blue light may be employed. In that case, a spacing (i.e., an optical distance) between the first electrode 18A and the second electrode 20 may be varied to extract each of desired wavelengths of light.

Furthermore, description of the embodiments, etc., has been made by giving an example of an active matrix type display device. However, the technology may be applied also to a passive matrix type display device. Moreover, a configuration of the pixel drive circuit for active matrix drive is not limited to that described in the above-described embodiments, and a capacitor or transistor may be added as necessary. In that case, another drive circuit may be added, besides the above-mentioned signal line drive circuit 120 and scanning line drive circuit 130, depending on a change in the pixel drive circuit.

Note that the effects described herein are merely exemplifications and not limited to those descriptions, other effects being possible. Moreover, the technology may adopt the following configurations.

(1) A display device including:
   a base;
   an organic light-emitting element including a stacked structure, the stacked structure having a first electrode layer, an organic light-emitting layer, and a second electrode layer that are stacked in order on the base;
   a drive element that is provided on the base, and drives the organic light-emitting element; and
   an auxiliary electrode layer provided on the base, and including an end surface that is in contact with the second electrode layer.

(2) The display device according to (1), wherein the auxiliary electrode layer is provided in a level that includes the drive element.

(3) The display device according to (1) or (2), wherein the auxiliary electrode layer has a thickness that is larger than a thickness of the organic light-emitting layer.

(4) The display device according to any one of (1) to (3), wherein the auxiliary electrode layer has conductivity that is higher than conductivity of the second electrode layer.

(5) The display device according to any one of (1) to (4), wherein the end surface of the auxiliary electrode layer is perpendicular to a surface of the base, or extends in an overhanging fashion in a direction of increasing distance from the base.

(6) The display device according to any one of (1) to (5), wherein the drive element includes a wiring line layer, and
the wiring line layer of the drive element has a constituent material that is same as a constituent material of the auxiliary electrode layer.
(7) The display device according to any one of (1) to (6), further including an underlayer provided between the base and the auxiliary electrode layer, wherein the drive element includes a gate electrode, and the underlayer has a constituent material that is same as a constituent material of the gate electrode.
(8) The display device according to any one of (1) to (7), wherein the second electrode layer has light transmittance that is higher than light transmittance of the auxiliary electrode layer.
(9) The display device according to any one of (1) to (8), wherein
the auxiliary electrode layer is formed by a vacuum vapor deposition method, and
the second electrode layer is formed by a sputter deposition method.
(10) The display device according to any one of (1) to (9), wherein
a portion of the auxiliary electrode layer is covered with an insulating layer, and
the insulating layer has an opening in a region overlapped with the auxiliary electrode layer.
(11) The display device according to (10), wherein an angle formed by a straight line and a direction that is perpendicular to a surface of the base is 45° or less, the straight line joining: an upper edge that faces the end surface of the auxiliary electrode layer in the opening of the insulating layer; and an upper edge of the end surface of the auxiliary electrode layer.
(12) A method of manufacturing a display device, the method including:
forming, on a base, a drive element and an auxiliary electrode layer;
forming a first insulating layer so as to cover the drive element and the auxiliary electrode layer;
forming a first opening on a portion of the first insulating layer to expose an end surface of the auxiliary electrode layer;
selectively forming a first electrode layer on the first insulating layer;
forming a second insulating layer on the first insulating layer, the second insulating layer having a second opening at a position that corresponds to the first electrode layer and a third opening at a position that corresponds to the auxiliary wiring line layer, the third opening being in communication with the first opening;
forming an organic light-emitting layer so as to cover the first electrode layer without covering the end surface of the auxiliary wiring line layer; and
forming a second electrode layer so as to cover both the organic light-emitting layer and the end surface of the auxiliary wiring line layer.
(12) An electronic apparatus with a display device, the display device including:
a base;
an organic light-emitting element including a stacked structure, the stacked structure having a first electrode layer, an organic light-emitting layer, and a second electrode layer that are stacked in order on the base;
a drive element that is provided on the base, and drives the organic light-emitting element; and
an auxiliary electrode layer provided on the base, and including an end surface that is in contact with the second electrode layer.

The present application is based on and claims priority from Japanese Patent Application No. 2014-192786 filed on Sep. 22, 2014 with the Japan Patent Office, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:
1. A display device, comprising:
a base;
an organic light-emitting element including a stacked structure, wherein the stacked structure comprises a first electrode layer, an organic light-emitting layer, and a second electrode layer that are stacked on the base;
a drive element on the base, wherein the drive element is configured to drive the organic light-emitting element; and
an auxiliary electrode layer on the base, wherein the auxiliary electrode layer includes an end surface that is in contact with the second electrode layer,
wherein a portion of the auxiliary electrode layer is covered with an insulating layer,
wherein the insulating layer has an opening in a region overlapped with the auxiliary electrode layer,
wherein an angle between a straight line and a direction that is perpendicular to a surface of the base is one of 45° or less, and
wherein the straight line joins a first upper edge that faces the end surface of the auxiliary electrode layer in the opening of the insulating layer and a second upper edge of the end surface of the auxiliary electrode layer.
2. The display device according to claim 1, wherein the auxiliary electrode layer is in a level that includes the drive element.
3. The display device according to claim 1, wherein the auxiliary electrode layer has a first thickness that is larger than a second thickness of the organic light-emitting layer.
4. The display device according to claim 1, wherein the auxiliary electrode layer has a first conductivity that is higher than a second conductivity of the second electrode layer.
5. The display device according to claim 1, wherein the end surface of the auxiliary electrode layer is one of perpendicular to the surface of the base or extends in a direction of distance which increases from the base.
6. The display device according to claim 1,
wherein the drive element includes a wiring line layer, and
wherein the wiring line layer of the drive element has a constituent material that is same as a constituent material of the auxiliary electrode layer.
7. The display device according to claim 1, further comprising an underlayer between the base and the auxiliary electrode layer,
wherein the drive element includes a gate electrode, and
wherein the underlayer has a constituent material that is same as a constituent material of the gate electrode.
8. The display device according to claim 1, wherein the second electrode layer has a first light transmittance that is higher than a second light transmittance of the auxiliary electrode layer.

9. The display device according to claim 1,
wherein the auxiliary electrode layer is a vacuum vapor deposited layer, and
wherein the second electrode layer is a sputter deposited layer.

10. A method of manufacturing a display device, the method comprising:
forming, on a base, a drive element and an auxiliary electrode layer;
forming a first insulating layer to cover the drive element and the auxiliary electrode layer;
forming a first opening on a portion of the first insulating layer to expose an end surface of the auxiliary electrode layer;
selectively forming a first electrode layer on the first insulating layer;
forming a second insulating layer on the first insulating layer,
wherein the second insulating layer comprises a second opening at a first position that corresponds to the first electrode layer and a third opening at a second position that corresponds to an auxiliary wiring line layer, and
wherein the third opening is in communication with the first opening;
forming an organic light-emitting layer to cover the first electrode layer without covering the end surface of the auxiliary electrode layer; and
forming a second electrode layer to cover both the organic light-emitting layer and the end surface of the auxiliary electrode layer,
wherein an angle between a straight line and a direction that is perpendicular to a surface of the base is one of 45° or less, and
wherein the straight line joins a first upper edge that faces the end surface of the auxiliary electrode layer in the first opening of the first insulating layer and a second upper edge of the end surface of the auxiliary electrode layer.

11. An electronic apparatus comprising a display device, wherein the display device comprises:
a base;
an organic light-emitting element including a stacked structure, wherein the stacked structure comprises a first electrode layer, an organic light-emitting layer, and a second electrode layer that are stacked on the base;
a drive element on the base, wherein the drive element is configured to drive the organic light-emitting element;
an auxiliary electrode layer on the base, wherein the auxiliary electrode layer includes an end surface that is in contact with the second electrode layer,
wherein a portion of the auxiliary electrode layer is covered with an insulating layer,
wherein the insulating layer has an opening in a region overlapped with the auxiliary electrode layer,
wherein an angle between a straight line and a direction that is perpendicular to a surface of the base is one of 45° or less, and
wherein the straight line joins a first upper edge that faces the end surface of the auxiliary electrode layer in the opening of the insulating layer and a second upper edge of the end surface of the auxiliary electrode layer.

* * * * *